(12) United States Patent
Zhang et al.

(10) Patent No.: US 11,139,459 B2
(45) Date of Patent: Oct. 5, 2021

(54) DISPLAY PANEL MOTHERBOARD AND METHOD OF MANUFACTURING DISPLAY PANEL MOTHERBOARD

(71) Applicant: Wuhan China Star Optoelectronics Semiconductor Display Technology Co., Ltd., Wuhan (CN)

(72) Inventors: Ming Zhang, Wuhan (CN); Jie Yang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 108 days.

(21) Appl. No.: 16/625,727

(22) PCT Filed: Nov. 5, 2019

(86) PCT No.: PCT/CN2019/115491
§ 371 (c)(1),
(2) Date: Dec. 22, 2019

(87) PCT Pub. No.: WO2021/017243
PCT Pub. Date: Feb. 4, 2021

(65) Prior Publication Data
US 2021/0234136 A1 Jul. 29, 2021

(30) Foreign Application Priority Data
Jul. 31, 2019 (CN) .......................... 201910699045.5

(51) Int. Cl.
*H01L 51/56* (2006.01)
*H01L 27/32* (2006.01)

(52) U.S. Cl.
CPC .......... *H01L 51/56* (2013.01); *H01L 27/3244* (2013.01); *H01L 2251/566* (2013.01)

(58) Field of Classification Search
None
See application file for complete search history.

(56) References Cited

U.S. PATENT DOCUMENTS

| | | | |
|---|---|---|---|
| 2016/0013253 A1* | 1/2016 | Lee | C23C 16/50 |
| | | | 257/40 |
| 2016/0315293 A1* | 10/2016 | You | B23K 26/18 |
| 2019/0288231 A1 | 9/2019 | He et al. | |
| 2020/0006704 A1* | 1/2020 | Zhang | H01L 51/0017 |

FOREIGN PATENT DOCUMENTS

| | | |
|---|---|---|
| CN | 107180923 | 9/2017 |
| CN | 107742476 | 2/2018 |
| CN | 108461525 | 8/2018 |
| CN | 108538899 | 9/2018 |

* cited by examiner

*Primary Examiner* — J. E. Schoenholtz (57) ABSTRACT

The present application provides a display panel motherboard and a method of manufacturing a display panel motherboard. The display panel motherboard includes a substrate; a plurality of display panels formed on the substrate; cutting grooves formed between front process layers of the plurality of display panels, wherein the cutting grooves comprise a first cutting groove and a second cutting groove, and an orthographic projection of the second cutting groove on the substrate covers and is larger than an orthographic projection of the first cutting groove on the substrate. The present application guarantees an effective area of package.

14 Claims, 5 Drawing Sheets

DISPLAY PANEL MOTHERBOARD AND METHOD OF MANUFACTURING DISPLAY PANEL MOTHERBOARD

RELATED APPLICATIONS

This application is a National Phase of PCT Patent Application No. PCT/CN2019/115491 having International filing date of Nov. 5, 2019, which claims the benefit of priority of Chinese Patent Application No. 201910699045.5 filed on Jul. 31, 2019. The contents of the above applications are all incorporated by reference as if fully set forth herein in their entirety.

FIELD AND BACKGROUND OF THE INVENTION

The present application relates to a field of display technologies, and in particular, to a display panel motherboard and a method of manufacturing a display panel motherboard.

During a manufacturing process of the display panel, a plurality of display panels are first formed on a motherboard, and after each display panel is packaged, the display panels are cut along the cutting area for separation.

In a packaging process of the display panel, an inorganic film in an encapsulation layer needs to be deposited on the display area and the non-display area of the display panel through an opening area of a mask. Since as a size of the panel is increased, a size of the mask is also increased gradually, the mask sags severely during packaging, resulting in an increased deposition range of the inorganic film, such that the inorganic film may extend to the cutting area during deposition, and when the cutting area is subsequently subjected to cutting, the inorganic film is also cut, causing the inorganic film to break, and the crack may extend to the display area of the display panel, impacting packaging effect of the display panel.

Therefore, the existing display panel has a technical problem that a cutting crack of an encapsulation layer extends to the display area, and needs to be improved.

SUMMARY OF THE INVENTION

The present application provides a display panel motherboard to alleviate the technical problem that a cutting crack of an encapsulation layer extends to the display area in the existing display panel.

To solve the above problem, the technical solution provided by the present application is as follows:

The present application provides a display panel motherboard, including: a substrate; a plurality of display panels formed on the substrate; cutting grooves formed between front process layers of the plurality of display panels, wherein the cutting grooves include a first cutting groove and a second cutting groove, and an orthographic projection of the second cutting groove on the substrate covers and is larger than an orthographic projection of the first cutting groove on the substrate.

In the display panel motherboard of the present application, the front process layers of the plurality of display panels include a base and an inorganic layer formed on the base.

In the display panel motherboard of the present application, the inorganic layer includes a buffer layer, a gate insulating layer, an interlayer dielectric layer, and a passivation layer.

In the display panel motherboard of the present application, the first cutting groove is formed in the inorganic layer, and the second cutting groove is formed in the base.

In the display panel motherboard of the present application, the first cutting groove and the second cutting groove are both formed in the inorganic layer.

In the display panel motherboard of the present application, the first cutting groove and the second cutting groove are formed in adjacent layers respectively.

In the display panel motherboard of the present application, a centerline of the cutting grooves coincides with a cutting line between adjacent ones of the plurality of display panels.

In the display panel motherboard of the present application, a difference between a width of the second cutting groove and a width of the first cutting groove is greater than 1 micrometer.

In the display panel motherboard of the present application, a half of a difference between a width of the second cutting groove and a width of the first cutting groove is greater than a depth of the second cutting groove.

In the display panel motherboard of the present application, the first cutting groove has a width greater than or equal to 100 microns.

The present application also provides a method of manufacturing a display panel motherboard, including: providing a substrate; forming front process layers of a plurality of display panels on the substrate; forming cutting grooves between adjacent ones of the plurality of display panels, the cutting grooves including a first cutting groove and a second cutting groove, an orthographic projection of the second cutting groove on the substrate covering and larger than an orthographic projection of the first cutting groove on the substrate; forming an encapsulation layer on the display panel; and cutting the cutting grooves to form a plurality of independent display panels.

In the method of manufacturing the display panel motherboard of the present application, the step of forming front process layers of a plurality of display panels on the substrate includes: forming a base on the substrate and forming an inorganic layer on the base.

In the method of manufacturing the display panel motherboard of the present application, the step of forming a base on the substrate and forming an inorganic layer on the base includes: forming a buffer layer, a gate insulating layer, an interlayer dielectric layer, and a passivation layer on the base.

In the method of manufacturing the display panel motherboard of the present application, the step of forming cutting grooves between adjacent ones of the plurality of display panels, the cutting grooves including a first cutting groove and a second cutting groove, and an orthographic projection of the second cutting groove on the substrate covering and larger than an orthographic projection of the first cutting groove on the substrate includes: forming the first cutting groove in the inorganic layer, and forming the second cutting groove in the base.

In the method of manufacturing the display panel motherboard of the present application, the step of forming cutting grooves between adjacent ones of the plurality of display panels, the cutting grooves including a first cutting groove and a second cutting groove, and an orthographic projection of the second cutting groove on the substrate covering and larger than an orthographic projection of the first cutting groove on the substrate includes: forming the first cutting groove and the second cutting groove in the inorganic layer.

In the method of manufacturing the display panel motherboard of the present application, the step of forming the first cutting groove and the second cutting groove in the inorganic layer includes: forming the first cutting groove and the second cutting groove in adjacent layers respectively.

In the method of manufacturing the display panel motherboard of the present application, the step of forming cutting grooves formed between adjacent ones of the plurality of display panels, the cutting grooves including a first cutting groove and a second cutting groove, and an orthographic projection of the second cutting groove on the substrate covering and larger than an orthographic projection of the first cutting groove on the substrate includes: forming the cutting grooves between adjacent ones of the plurality of display panels, a centerline of the cutting grooves coinciding with a cutting line between adjacent ones of the plurality of display panels.

In the method of manufacturing the display panel motherboard of the present application, the step of forming the cutting grooves between adjacent ones of the plurality of display panels, a centerline of the cutting grooves coinciding with a cutting line between adjacent ones of the plurality of display panels includes: forming the first cutting groove and the second cutting groove having a width larger than the first cutting groove by 1 mm.

In the method of manufacturing the display panel motherboard of the present application, the step of forming the cutting grooves between adjacent ones of the plurality of display panels, a centerline of the cutting grooves coinciding with a cutting line between adjacent ones of the plurality of display panels includes: forming the first cutting groove and the second cutting groove, the second cutting groove having a depth smaller than a half of a difference between a width of the second cutting groove width and a width of the first cutting groove.

In the method of manufacturing the display panel motherboard of the present application, the step of forming the cutting grooves between adjacent ones of the plurality of display panels, a centerline of the cutting grooves coinciding with a cutting line between adjacent ones of the plurality of display panels includes: forming the first cutting groove having a width greater than or equal to 100 microns.

The present application provides a display panel motherboard and a method of manufacturing a display panel motherboard. The display panel motherboard includes a substrate; a plurality of display panels formed on the substrate; cutting grooves formed between front process layers of the plurality of display panels, wherein the cutting grooves include a first cutting groove and a second cutting groove, and an orthographic projection of the second cutting groove on the substrate covers and is larger than an orthographic projection of the first cutting groove on the substrate. By forming the first cutting groove and the second cutting groove in the front process layers between adjacent ones of the display panels, when the inorganic film in the encapsulation layer is deposited in the cutting grooves in the subsequent processes, the inorganic film is automatically broken, and the cutting cracks are confined in the cutting grooves and do not propagate into the display panel, effectively ensuring the effective area and its reliability of package.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

The following description of the various embodiments is provided to illustrate the specific embodiments of the invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. In the figures, structurally similar elements are denoted by the same reference numerals.

The present application provides a display panel motherboard to alleviate the technical problem that a cutting crack of an encapsulation layer extends to the display area in the existing display panel.

Figure 2:
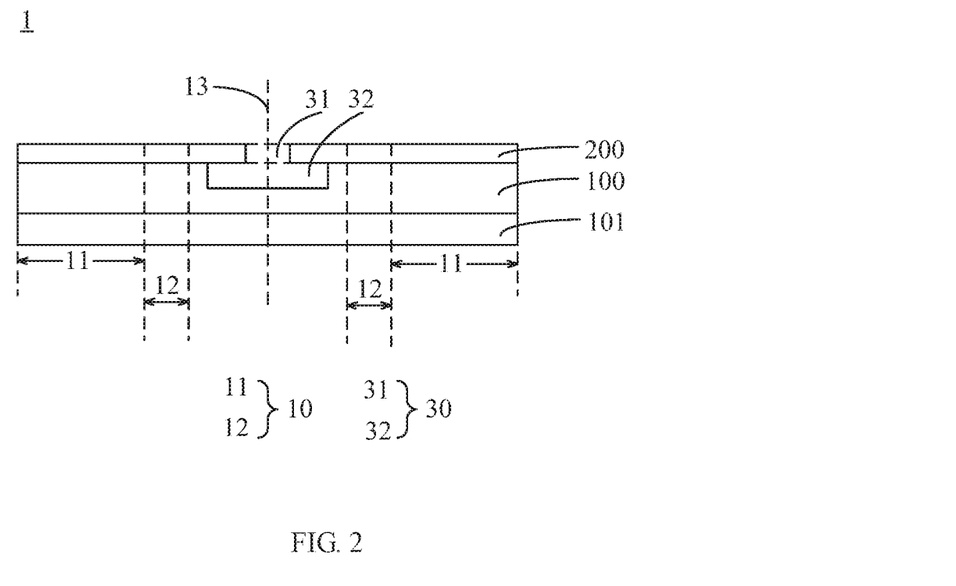
FIG. 2 is a schematic structural diagram of a display panel motherboard according to an embodiment of the present application.
Figure 3:
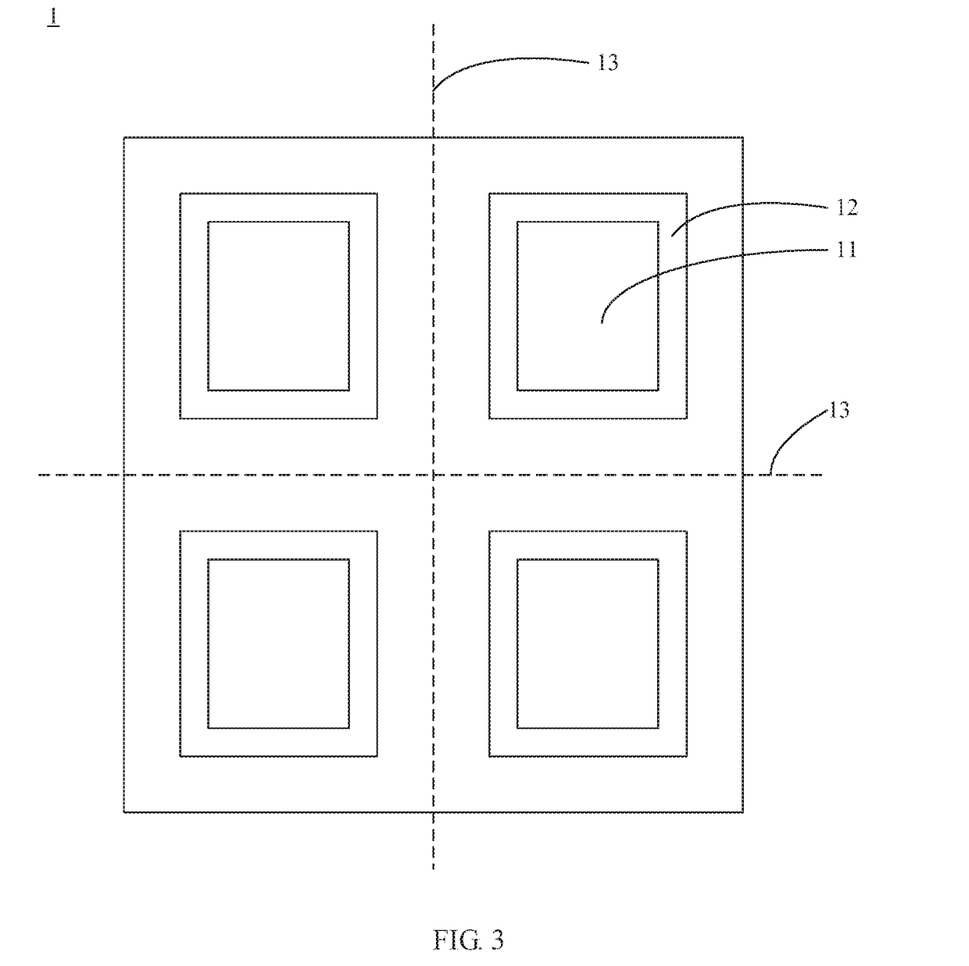
FIG. 3 is a schematic top view of a display panel motherboard according to an embodiment of the present application.

As shown in FIG. 2 and FIG. 3, the present application provides a display panel motherboard 1 including a substrate 101 and a plurality of display panels 10 formed on the substrate 101; cutting grooves 30 formed between front process layers (not shown) of the plurality of display panels 10, wherein the cutting grooves 30 include a first cutting groove 31 and a second cutting groove 32, and an orthographic projection of the second cutting groove 32 on the substrate 101 covers and is larger than an orthographic projection of the first cutting groove 31 on the substrate 101.

During the manufacturing process of the display panel 10, the plurality of display panels 10 are first formed on the same substrate 101. After the formation of the front process layers (not shown) are completed, the display panel 10 is packaged. Then, the obtained display panel motherboard 1 is cut along a cutting line 13 provided in advance, so that the plurality of display panels of the same specification can be obtained by one time of the manufacturing process of the display panel, which greatly shortens the manufacturing time and reduces the manufacturing cost. The cutting line 13 is located between adjacent ones of the display panels 10, and the cutting line 13 is usually located at a middle of the adjacent display panel 10, that is, adjacent ones of the display panels 10 are disposed symmetrically with respect to the cutting line 13.

The front process layers of the display panel 10 are layers formed before the formation of the cutting grooves 30, and includes a base 100 and an inorganic layer 200 formed on the base 100. In this embodiment, the display panel 10 is a flexible organic light-emitting diode (OLED) display panel. As such, the base 100 is a flexible substrate. The flexible substrate cannot be directly used, and needs to be formed on the rigid substrate 101 before performing subsequent processes. Of course, the display panel 10 can also be a rigid display panel, in which case the substrate 101 and the base 100 are the same layer.

After the substrate 10 is formed, a driving circuit layer (not shown) of the display panel 10 is formed. The driving circuit layer includes a metal layer, an inorganic layer 200, and the like, wherein the metal layer is formed only in the display area 11 of the display panel 10, In the area between adjacent ones of the display panels 10, only the inorganic layer 200 is included.

After the formation of the front process layers is completed, the display panel 10 needs to be packaged to be isolated from water and oxygen. In this embodiment of the present application, thin film package is employed, that is, a laminated structure of an inorganic film and an organic film is introduced, and the package area is a display area 11 and a non-display area 12 of the display panel 10. After the package is completed, the display panel motherboard 1 is cut along the cutting line 13 to obtain a plurality of independent display panels 10.

The cutting grooves 30 are formed between adjacent ones of the display panels 10, including an upper portion and a lower portion, wherein the upper portion is the first cutting groove 31, and formed with an opening (not shown), and the lower portion is the second cutting groove 32. The first cutting groove 31 and the second cutting groove 32 are connected to each other, that is, the first cutting groove 31 and the second cutting groove 32 are communicated with each other. An orthographic projection of the second cutting groove 32 on the substrate 101 covers and is larger than an orthographic projection of the first cutting groove 31 on the substrate 101, that is, the projection of the first cutting groove 31 on the base 100 falls within the projection of the second cutting groove 32 on the base 100, and a width of the first cutting groove 31 is smaller than a width of the second cutting groove 32, wherein the widths refer to widths in the direction perpendicular to the cutting line 13.

The first cutting groove 31 and the second cutting groove 32 form a cutting groove 30 having a "convex" cross section. In each area to be cut, a cutting groove 30 is provided.

Figure 1:
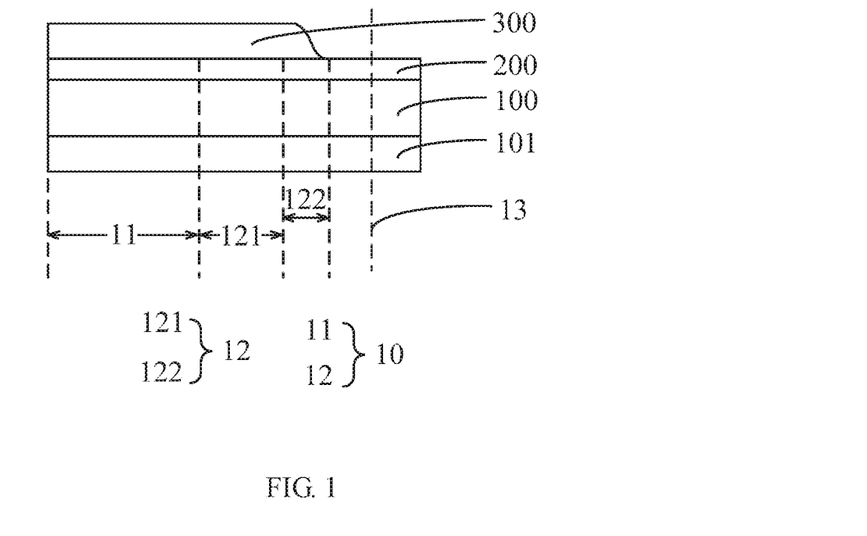
FIG. 1 is a schematic structural view of a display panel in the prior art.

As shown in FIG. 1, in the prior art, the display panel 10 is cut after the package is completed. The display panel 10 is an organic light-emitting diode (OLED) display panel, and the OLED display panel is mostly packaged by a thin film packaging technology. Material used for the thin film package mainly adopts a laminated structure of an inorganic film 300 and an organic thin film, and the package area includes a display area 11 and a non-display area 12 of the display panel 10.

In a packaging process, the inorganic film 300 in the encapsulation layer is deposited on the display area 11 and the non-display area 12 of the display panel 10 by chemical vapor deposition, and the inorganic material is deposited on the display panel 10 through the opening area of the mask. Each opening area of the mask is disposed correspondingly to the display area 11 and the non-display area 12 of one of the display panels 10.

In an ideal state, the inorganic film 300 is deposited only on the display area 11 and the non-display area 12 of the display panel 10. However, since as a size of the panel is increased, a size of the mask is increased gradually, the mask sags severely under the effect of gravity, that is, an edge area of the mask is inclined, and an actual deposition area of the inorganic material is larger than an ideal value during the package, that is, the inorganic film 300 is extended and deposited in the area to be cut, and when the area is subsequently cut, the inorganic film in the encapsulation layer is also cut, causing the inorganic film to break, and the cracks may extend to the display area 11 of the display panel 10, eventually impacting the packaging effect of the display panel 10.

Therefore, in order to prevent the inorganic film 300 from being deposited in the cutting area 20, a certain space is reserved in the non-display area 12 in the prior art, that is, the non-display area 12 includes the original non-display area 121 and an extended non-display area 122, so that an inorganic film 300 originally to be deposited in the cutting area is deposited on the extended non-display area 122. Although such a structure alleviates the generation of the cracks of the inorganic film 300 to a certain extent, since the width of the non-display area 12 is increased, it is disadvantageous to realize the narrow bezel design of the display panel 10.

In the present application, by providing a cutting groove 30 between adjacent ones of the display panels 10, the inorganic film 300 is deposited in the cutting grooves 30 and automatically broken during subsequent package, and the cracks in the unbroken portion generated during the cutting is limited to be in the cutting grooves 30, not propagating into the display area 11, thereby ensuring the packaging effect.

In addition, due to the presence of the cutting grooves 30, it is not necessary to provide a reserved space in the non-display area 12, which reduces the width of the non-display area 12, thus realizing a narrow bezel.

Figure 4:
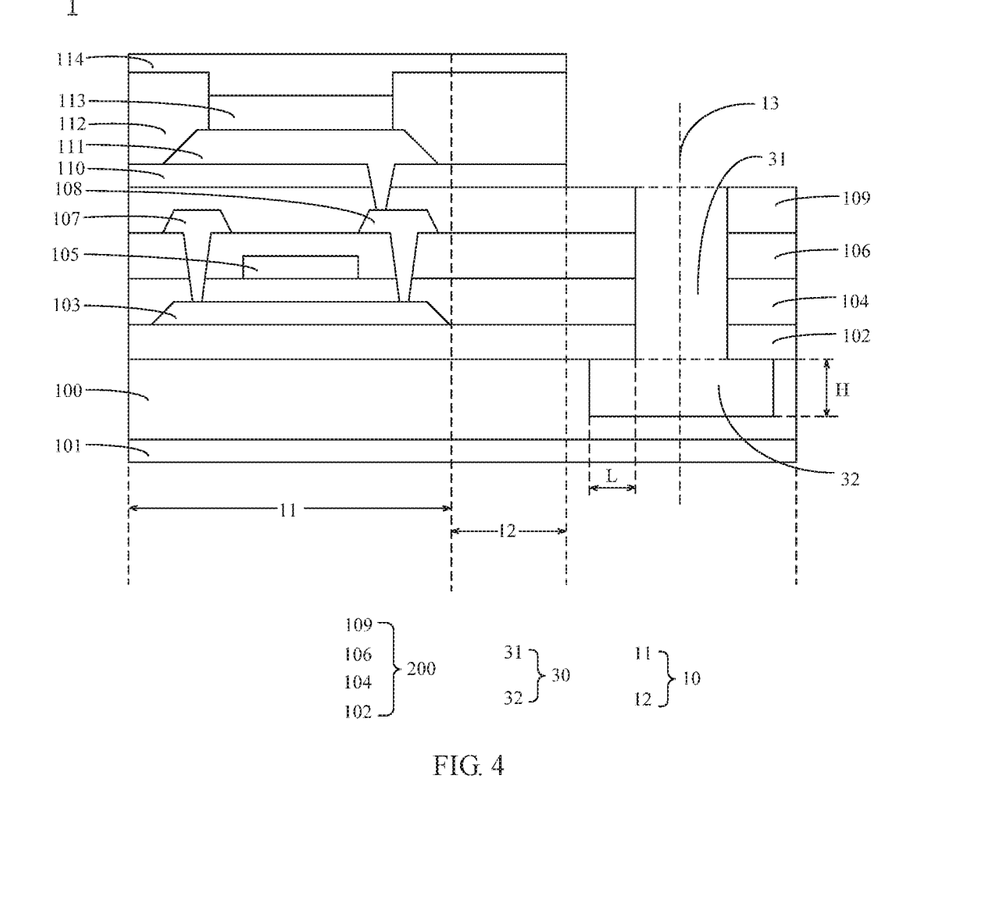
FIG. 4 is a schematic view showing a first structure of a cutting groove in a display panel motherboard according to an embodiment of the present application.

The cutting grooves 30 may be formed in the cutting area 20 by various means. As shown in FIG. 4, it is the first means of forming the cutting grooves 30. The display panel in this embodiment is an organic light-emitting diode (OLED) display panel.

During forming the display panel motherboard 1, an entire substrate 101 is provided first, and the substrate 101 is a rigid substrate, usually made of glass. A base 100 is further formed on the substrate 101. In this embodiment, the display panel 10 is a flexible organic light-emitting diode (OLED) display panel, and the base 100 is a flexible base, made of polyimide.

In one embodiment, the display panel 10 can also be a rigid display panel, wherein the substrate 101 and the base 100 are the same layer.

A buffer layer 102 is formed on one side of the base 100, and material of the buffer layer 102 may be an inorganic material such as silicon oxide, silicon nitride, etc.

An active layer 103 is formed on the buffer layer 102 and in the display area 11. Material of the active layer 103 is a metal oxide, such as indium gallium zinc oxide (IGZO), but not particularly limited thereto, and may include one or more of aluminum zinc oxide (AZO), indium zinc oxide (IZO), zinc oxide (ZnO), indium oxide ($In_2O_3$), boron-doped zinc oxide (BZO), and magnesium-doped zinc oxide (MZO). Further, the active layer 104 may also be made of a polysilicon material or other materials.

A gate insulating layer 104 is formed on the active layer, and material of the gate insulating layer 107 may be an inorganic material such as silicon oxide, silicon nitride, etc.

A gate layer is formed on the gate insulating layer 104. Material of the gate layer may be molybdenum, aluminum, or copper, but not particularly limited thereto, and may also be a material such as chromium, tungsten, titanium, tantalum, or alloys containing the same, which is not particularly limited. The gate layer is patterned by an etching process to form a gate electrode 105, and the gate electrode 105 is formed in the display area 11.

An interlayer dielectric layer 106 is formed on the gate layer, and material of the interlayer dielectric layer 109 may be an inorganic material such as silicon oxide, silicon nitride, etc.

A source drain layer is formed on the interlayer dielectric layer 106. Material of the source drain layer may be molybdenum, aluminum, or copper, but not particularly limited thereto, and may also be chromium, tungsten, titanium, tantalum, or alloys containing the same. The material is patterned by an etching process to form a source 107 and a drain 108. The source 107 and the drain 108 are connected to the active layer 103 through a first via hole (not shown), and the source 107 and the drain 108 are formed in the display area 11.

A passivation layer 109 is formed on the source drain layer, and material of the passivation layer 109 may be an inorganic material such as silicon oxide, silicon nitride, etc.

A planarization layer 110 is further formed on the passivation layer 109. Material of the planarization layer 110 is a photoresist, which is formed on the passivation layer 110 by coating.

A pixel defining layer 112 is formed on the planarization layer 110. A pixel electrode 111 is disposed in the opening area of the pixel defining layer 112. The pixel electrode 111 is connected to the drain electrode 108 through a second via hole (not shown). A luminescent material layer 113 and a common electrode 114 are also formed on the pixel electrode 111.

In the manufacturing process of the display panel 10, after the formation of the passivation layer 109 is completed, the cutting grooves 30 are formed first, and then other layers are formed on the display area 11 and the non-display area 12 of the display panel 10, and finally packaged. The layers before the formation of the cutting grooves 30 constitutes the front process layers of the display panel 10, and the number of film types of the front process layers in each area is different.

As shown in FIG. 4, the front process layers in the display area 11 includes a base 100, an inorganic layer 200, a metal layer, and the like, and only the base 100 and the inorganic layer 200 are disposed in the cutting area, wherein the inorganic layer 200 includes a buffer layer 102, the gate insulating layer 104, the interlayer dielectric layer 106, and the passivation layer 109, which are all made of an inorganic material such as silicon oxide, or silicon nitride.

In this embodiment, the first cutting groove 31 is formed in the inorganic layer 200, and the second cutting groove 32 is formed in the base 100, that is, the first cutting groove 31 is formed in the buffer layer 102, the gate insulating layer 104, the interlayer dielectric layer 106, and the passivation layer 109.

During forming the cutting grooves 30, the inorganic layer 200 is first etched to form a first cutting groove 31. A centerline of the first cutting groove 31 coincides with a cutting line 13 between adjacent ones of the plurality of display panels, and a width the first cutting groove 31 is greater than a width of a cutting member that actually performs the cutting. In one embodiment, the width of the first cutting groove 31 is greater than or equal to 100 microns.

The base 100 is etched to form a second cutting groove 32. A centerline of the second cutting groove 32 also coincides with a cutting line 13 between adjacent ones of the plurality of display panels, and a difference between a width of the second cutting groove 32 and the width of the first cutting groove 31 is greater than 1 micrometer. That is, the reference number L in FIG. 4 is greater than 0.5 micrometers. A half of the difference between the width of the second cutting groove 32 and the width of the first cutting groove 31 is L, greater than a depth H of the second cutting groove 32.

In addition, the depth H of the second cutting groove 32 is less than or equal to the thickness of the layer formed in the second cutting groove 32. Since the second cutting groove 32 is formed in the base 100 in this embodiment, and the base 100 is the bottom layer, the depth H of the second cutting groove 32 is smaller than a thickness of the base 100.

Figure 5:
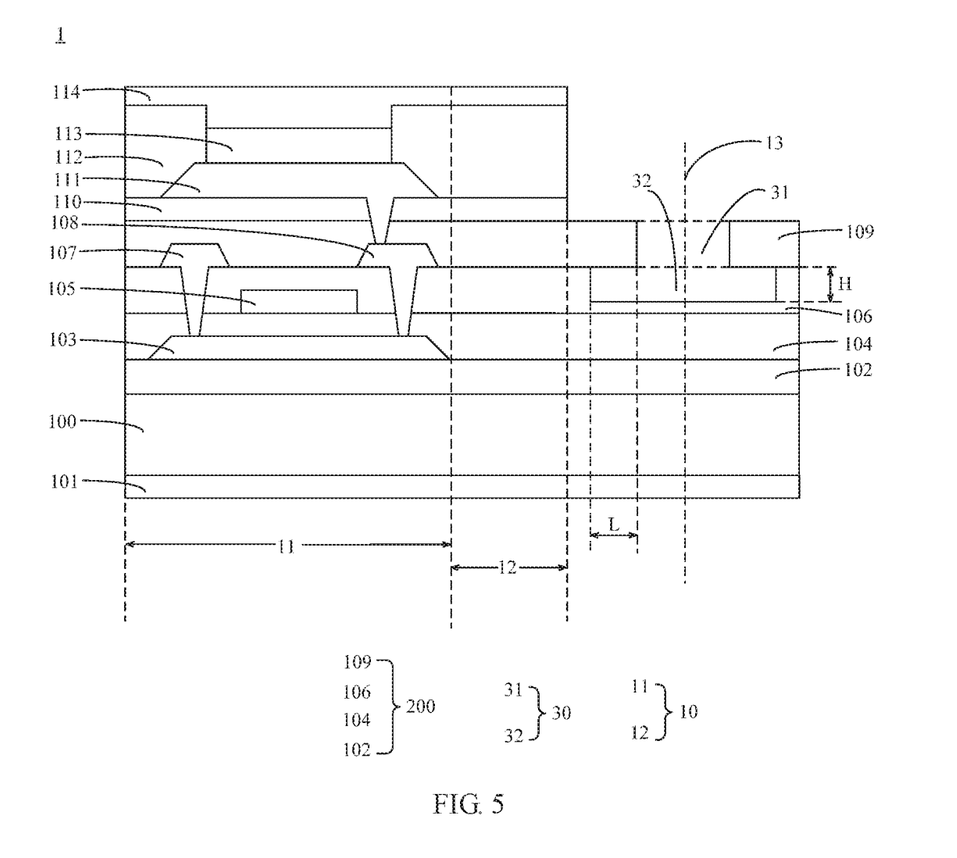
FIG. 5 is a schematic view showing a second structure of a cutting groove in a display panel motherboard according to an embodiment of the present application.

As shown in FIG. 5, it is the second means of forming the cutting grooves 30. A difference from the structure in FIG. 4 is that both the first cutting groove 31 and the second cutting groove 32 are formed in the inorganic layer 200 in this embodiment.

The first cutting groove 31 and the second cutting groove 32 may be formed in the same layer or in different layers. In this embodiment, the first cutting groove 31 and the second cutting groove 32 are formed in adjacent layers respectively. As exemplified in FIG. 5, the first cutting groove 31 is formed in the passivation layer 109, and the second cutting groove 32 is formed in the interlayer dielectric layer 106.

Since each of the layers in the inorganic layer 200 may be made of silicon nitride or silicon oxide, the first cutting groove 31 and the second cutting groove 32 are formed by etching with the same substance. The layer formed in the first cutting groove 31 is made of silicon oxide, and the layer formed in the second cutting groove 32 is made of silicon nitride. Accordingly, the cutting grooves 30 are formed based on the large discrepancy in etch rates between etching silicon oxide and etching silicon nitride with a same substance (such as acid).

During forming the cutting grooves 30, the passivation layer 109 is first etched to form the first cutting groove 31. After the formation of the first cutting groove 31, the interlayer dielectric layer 106 is etched with a substance same as that used for etching the passivation layer 109. The material of the passivation layer 109 is set to be silicon oxide, and the material of the dielectric layer 106 is set to be silicon nitride. When the interlayer dielectric layer 106 is etched with an acid, since an etch rate of the silicon nitride is greater than an etch rate of the silicon oxide, after the first cutting groove 31 is formed, the interlayer dielectric layer 106 under the first cutting groove 31 is etched first, and when the interlayer dielectric layer 106 under the remaining passivation layer 109 is etched, during the same period of time, the interlayer dielectric layer 106 under the remaining passivation layer 109 is etched to have a desired width L, and a region of the passivation layer 109 in contact with the acid is etched only with a small portion, which can be negligible. Finally, a second cutting groove 32 having the width larger than the width of the first cutting groove 31 is formed, and the first cutting groove 31 and the second cutting groove 32 form a structure having a "convex" cross section.

During forming the cutting grooves 30, the passivation layer 109 is first etched to form a first cutting groove 31. A centerline of the first cutting groove 31 coincides with a cutting line (not shown) between adjacent ones of the plurality of display panels, and a width the first cutting groove 31 is greater than a width of a cutting member that actually performs the cutting. In one embodiment, the width of the first cutting groove 31 is greater than or equal to 100 microns.

The interlayer dielectric layer 106 is further etched to form a second cutting groove 32. A centerline of the second cutting groove 32 also coincides with a cutting line between adjacent ones of the plurality of display panels, and a difference between a width of the second cutting groove 32 and the width of the first cutting groove 31 is greater than 1 micrometer. That is, the reference number L in FIG. 5 is greater than 0.5 micrometers. A half of the difference between the width of the second cutting groove 32 and the width of the first cutting groove 31 is L, greater than a depth H of the second cutting groove 32.

In addition, the depth H of the second cutting groove 32 is less than or equal to a thickness of the layer formed in the second cutting groove 32. Since the second cutting groove 32 is formed in the interlayer dielectric layer 106 in this embodiment, the depth H of the second cutting groove 32 is less than or equal to a thickness of the interlayer dielectric layer 106.

Of course, the manner of forming the cutting grooves 30 is not particularly limited thereto.

In one embodiment, the first cutting groove 31 is formed in the passivation layer 109, and the second cutting groove is formed in the interlayer dielectric layer 106 and the gate insulating layer 104. Material of the passivation layer 109 is silicon oxide. Material of the dielectric layer 106 and the gate insulating layer 104 is silicon nitride. A depth H of the second cutting groove 32 is less than or equal to a sum of the thicknesses of the interlayer dielectric layer 106 and the gate insulating layer 104.

In one embodiment, the first cutting groove 31 is formed in the passivation layer 109, and the second cutting groove is formed in the interlayer dielectric layer 106, the gate insulating layer 104, and the buffer layer 102. Material of the passivation layer 109 is silicon oxide. The interlayer dielectric layer 106, the gate insulating layer 104, and the buffer layer 102 are made of silicon nitride. The second cutting groove 32 has a depth H less than or equal to a sum of the thicknesses of the interlayer dielectric layer 106, the gate insulating layer 104, and the buffer layer 102.

In one embodiment, the first cutting groove 31 is formed in the passivation layer 109 and the interlayer dielectric layer 106, and the second cutting groove is formed in the gate insulating layer 104. The passivation layer 109 and the interlayer dielectric layer 106 are made of silicon oxide, and the gate insulating layer 104 is made of silicon nitride. A depth H of the second cutting groove 32 is less than or equal to the thickness of the gate insulating layer 104.

In one embodiment, the first cutting groove 31 is formed in the passivation layer 109 and the interlayer dielectric layer 106, and the second cutting groove is formed in the gate insulating layer 104 and the buffer layer 102. The passivation layer 109 and the interlayer dielectric layer 106 are made of silicon oxide, and the gate insulating layer 104 and the buffer layer 102 are made of silicon nitride. A depth H of the second cutting groove 32 is less than or equal to a sum of the thicknesses of the gate insulating layer 104 and the buffer layer 102.

In one embodiment, the first cutting groove 31 is formed in the passivation layer 109, the interlayer dielectric layer 106, and the gate insulating layer 104, and the second cutting groove is formed in the buffer layer 102, the passivation layer 109, and the interlayer dielectric layer 106 and the gate insulating layer 104 are made of silicon oxide, and the buffer layer 102 is made of silicon nitride. A depth H of the second cutting groove 32 is less than or equal to the thickness of the buffer layer 102.

A person skilled in the art can design which layers and materials corresponding to the layer for forming the first cutting groove 31 and the second cutting groove 32 according to actuals requirements.

In the present application, by providing a cutting groove 30 between adjacent ones of the display panels 10, the inorganic film 300 is deposited in the cutting grooves 30 and automatically broken during subsequent package, and the cracks in the unbroken portion generated during the cutting is limited to be in the cutting grooves 30, not propagating into the display area 11, thereby ensuring the packaging effect.

In addition, due to the presence of the cutting grooves 30, it is not necessary to provide a reserved space in the non-display area 12, which reduces the width of the non-display area 12, thus realizing a narrow bezel.

Figure 6:
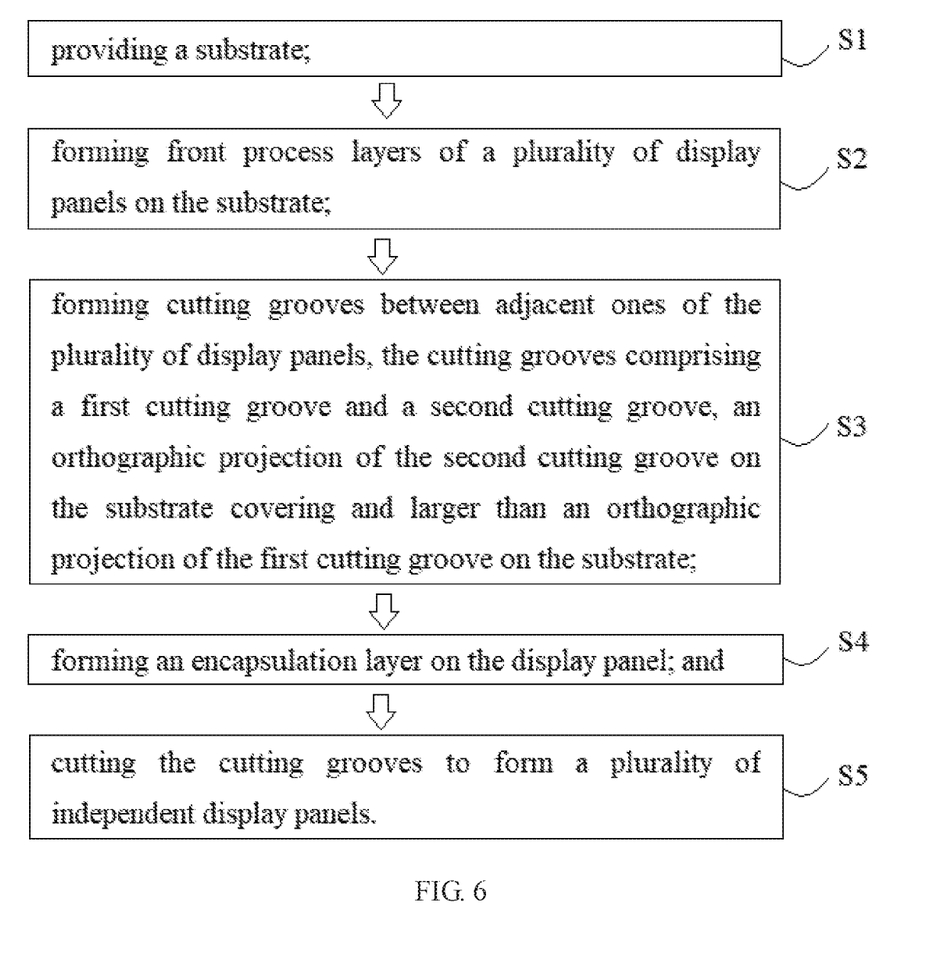
FIG. 6 is a schematic flow chart of a method of manufacturing a display panel motherboard according to an embodiment of the present application.

As shown in FIG. 6, the present application further provides a method of manufacturing a display panel motherboard, the method including the following steps:

S1: providing a substrate;

S2: forming front process layers of a plurality of display panels on the substrate;

S3: forming cutting grooves between adjacent ones of the plurality of display panels, the cutting grooves including a first cutting groove and a second cutting groove, an orthographic projection of the second cutting groove on the substrate covering and larger than an orthographic projection of the first cutting groove on the substrate;

S4: forming an encapsulation layer on the display panel; and

S5: cutting the cutting grooves to form a plurality of independent display panels.

The manufacturing method will be specifically described below with reference to FIGS. 1 to 6.

In S1, a substrate 101 is provided. During forming the display panel motherboard 1, an entire substrate 101 is provided first, and the substrate 101 is a rigid substrate, usually made of glass.

In S2, front process layers of a plurality of display panels are formed on a substrate. The front process layers include a base 100 and an inorganic layer 200.

The base 100 is first formed on the substrate 101. In this embodiment, the display panel 10 is a flexible organic light-emitting diode (OLED) display panel, and the base 100 is a flexible base, made of polyimide.

In one embodiment, the display panel 10 can also be a rigid display panel, wherein the substrate 101 and the base 100 are the same layer.

After the base 100 is formed, other layers are formed on the base 100. As shown in FIG. 4 or FIG. 5, the other layers include a buffer layer 102, an active layer 103, a gate insulating layer 104, and the gate layer, an interlayer dielectric layer 106, a source drain layer, and a passivation layer 109. The base 100 and the above-mentioned layers constitute the front process layers of the display panel 10, and a number of film types of the front process layers is different in each area.

The display panel motherboard 1 includes a plurality of display panels 10, and an area between adjacent ones of the display panels 10 is an area subsequently to be cut. The display panel 10 includes a display area 11 and a non-display area 12. In the display panel 10, the front process layers include the base 100, an inorganic layer 200, the metal layer, and the like, and only the base 100 and the inorganic layer are disposed in the cutting area. 200, wherein the inorganic layer 200 includes the buffer layer 102, the gate insulating layer 104, an interlayer dielectric layer 106, and the passivation layer 109, all of which are made of an inorganic material such as silicon oxide, silicon nitride, etc.

In S3, a cutting groove 30 is formed between adjacent ones of the display panels 10. The cutting grooves 30 includes a first cutting groove 31 and a second cutting groove 32, and an orthographic projection of the second cutting groove 32 on the substrate 101 covers and is larger than an orthographic projection of the first cutting groove 31 on the substrate 101.

The cutting grooves 30 are formed between adjacent ones of the display panels 10, including an upper portion and a lower portion, wherein the upper portion is the first cutting groove 31, and formed with an opening (not shown), and the lower portion is the second cutting groove 32. The first cutting groove 31 and the second cutting groove 32 are connected to each other, that is, the first cutting groove 31 and the second cutting groove 32 are communicated with each other. An orthographic projection of the second cutting groove 32 on the substrate 101 covers and is larger than an orthographic projection of the first cutting groove 31 on the substrate 101, that is, the projection of the first cutting groove 31 on the base 100 falls within the projection of the second cutting groove 32 on the base 100, and a width of the first cutting groove 31 is smaller than a width of the second cutting groove 32, the widths refer to widths in the direction perpendicular to the cutting line 13.

The first cutting groove 31 and the second cutting groove 32 form a cutting groove 30 having a "convex" cross section. In each area to be cut, a cutting groove 30 is provided.

The cutting grooves 30 may be formed in different layers.

In one embodiment, as shown in FIG. 4, the first cutting groove 31 is formed in the inorganic layer 200, and the second cutting groove 32 is formed in the base 100, that is, the first cutting groove 31 is formed in the buffer layer 102, the gate insulating layer 104, the interlayer dielectric layer 106, and the passivation layer 109.

During forming the cutting grooves 30, the inorganic layer 200 is first etched to form a first cutting groove 31. A centerline of the first cutting groove 31 coincides with a cutting line 13 between adjacent ones of the plurality of display panels, and a width the first cutting groove 31 is greater than a width of a cutting member that actually performs the cutting. In one embodiment, the width of the first cutting groove 31 is greater than or equal to 100 microns.

The base 100 is etched to form a second cutting groove 32. A centerline of the second cutting groove 32 also coincides with a cutting line 13 between adjacent ones of the plurality of display panels 10, and a difference between a width of the second cutting groove 32 and the width of the first cutting groove 31 is greater than 1 micrometer. That is, the reference number L in FIG. 4 is greater than 0.5 micrometers. A half of the difference between the width of the second cutting groove 32 and the width of the first cutting groove 31 is L, greater than a depth H of the second cutting groove 32.

In addition, the depth H of the second cutting groove 32 is less than or equal to the thickness of the layer formed in the second cutting groove 32. Since the second cutting groove 32 is formed in the base 100 in this embodiment, and the base 100 is the bottom layer, the depth H of the second cutting groove 32 is smaller than a thickness of the base 100.

In one embodiment, as shown in FIG. 5, the first cutting groove 31 and the second cutting groove 32 are both formed in the inorganic layer 200. The first cutting groove 31 and the second cutting groove 32 may be formed in the same layer or in different layers. In this embodiment, the first cutting groove 31 and the second cutting groove 32 are formed in adjacent layers respectively. As exemplified in FIG. 5, the first cutting groove 31 is formed in the passivation layer 109, and the second cutting groove 32 is formed in the interlayer dielectric layer 106.

Since each of the layers in the inorganic layer 200 may be made of silicon nitride or silicon oxide, the first cutting groove 31 and the second cutting groove 32 are formed by etching with the same substance. The layer formed in the first cutting groove 31 is made of silicon oxide, and the layer formed in the second cutting groove 32 is made of silicon nitride. Accordingly, the cutting grooves 30 are formed based on the large discrepancy in etch rates between etching silicon oxide and etching silicon nitride with a same substance (such as acid).

During forming the cutting grooves 30, the passivation layer 109 is first etched to form the first cutting groove 31. After the formation of the first cutting groove 31, the interlayer dielectric layer 106 is etched with a material same as that used for etching the passivation layer 109. The material of the passivation layer 109 is set to be silicon oxide, and the material of the dielectric layer 106 is set to be silicon nitride. When the interlayer dielectric layer 106 is etched with an acid, since an etch rate of the silicon nitride is greater than an etch rate of the silicon oxide, after the first cutting groove 31 is formed, the interlayer dielectric layer 106 under the first cutting groove 31 is etched first, and when the interlayer dielectric layer 106 under the remaining passivation layer 109 is etched, during the same period of time, the interlayer dielectric layer 106 under the remaining passivation layer 109 is etched to have a desired width L, and a region of the passivation layer 109 in contact with the acid is etched only with a small portion, which can be negligible. Finally, a second cutting groove 32 having the width larger than the width of the first cutting groove 31 is formed, and the first cutting groove 31 and the second cutting groove 32 form a structure having a "convex" cross section.

During forming the cutting grooves 30, the passivation layer 109 is first etched to form a first cutting groove 31. A centerline of the first cutting groove 31 coincides with a cutting line (not shown) between adjacent ones of the plurality of display panels, and a width the first cutting groove 31 is greater than a width of a cutting member that actually performs the cutting. In one embodiment, the width of the first cutting groove 31 is greater than or equal to 100 microns.

The interlayer dielectric layer 106 is further etched to form a second cutting groove 32. A centerline of the second cutting groove 32 also coincides with a cutting line 13 between adjacent ones of the plurality of display panels, and a difference between a width of the second cutting groove 32 and the width of the first cutting groove 31 is greater than 1 micrometer. That is, the reference number L in FIG. 5 is greater than 0.5 micrometers. A half of the difference between the width of the second cutting groove 32 and the width of the first cutting groove 31 is L, greater than a depth H of the second cutting groove 32.

In addition, the depth H of the second cutting groove 32 is less than or equal to a thickness of the layer formed in the second cutting groove 32. Since the second cutting groove 32 is formed in the interlayer dielectric layer 106 in this embodiment, the depth H of the second cutting groove 32 is less than or equal to a thickness of the interlayer dielectric layer 106.

Of course, the manner of forming the cutting grooves 30 is not particularly limited thereto.

In one embodiment, the first cutting groove 31 is formed in the passivation layer 109, and the second cutting groove is formed in the interlayer dielectric layer 106 and the gate insulating layer 104. Material of the passivation layer 109 is silicon oxide. Material of the dielectric layer 106 and the gate insulating layer 104 is silicon nitride. A depth H of the second cutting groove 32 is less than or equal to a sum of the thicknesses of the interlayer dielectric layer 106 and the gate insulating layer 104.

In one embodiment, the first cutting groove 31 is formed in the passivation layer 109, and the second cutting groove is formed in the interlayer dielectric layer 106, the gate insulating layer 104, and the buffer layer 102. Material of the passivation layer 109 is silicon oxide. The interlayer dielectric layer 106, the gate insulating layer 104, and the buffer layer 102 are made of silicon nitride. The second cutting groove 32 has a depth H less than or equal to a sum of the thicknesses of the interlayer dielectric layer 106, the gate insulating layer 104, and the buffer layer 102.

In one embodiment, the first cutting groove 31 is formed in the passivation layer 109 and the interlayer dielectric layer 106, and the second cutting groove is formed in the gate insulating layer 104. The passivation layer 109 and the interlayer dielectric layer 106 are made of silicon oxide, and the gate insulating layer 104 is made of silicon nitride. A depth H of the second cutting groove 32 is less than or equal to the thickness of the gate insulating layer 104.

In one embodiment, the first cutting groove 31 is formed in the passivation layer 109 and the interlayer dielectric layer 106, and the second cutting groove is formed in the gate insulating layer 104 and the buffer layer 102. The passivation layer 109 and the interlayer dielectric layer 106 are made of silicon oxide, and the gate insulating layer 104 and the buffer layer 102 are made of silicon nitride. A depth H of the second cutting groove 32 is less than or equal to a sum of the thicknesses of the gate insulating layer 104 and the buffer layer 102.

In one embodiment, the first cutting groove 31 is formed in the passivation layer 109, the interlayer dielectric layer 106, and the gate insulating layer 104, and the second cutting groove is formed in the buffer layer 102, the passivation layer 109, and the interlayer The dielectric layer 106 and the gate insulating layer 104 are made of silicon oxide, and the buffer layer 102 is made of silicon nitride. A depth H of the second cutting groove 32 is less than or equal to the thickness of the buffer layer 102.

A person skilled in the art can design which layers and materials corresponding to the layer for forming the first cutting groove 31 and the second cutting groove 32 according to actuals requirements.

In S4, an encapsulation layer is formed on the display panel 10.

Before the encapsulation layer is formed, as shown in FIG. 4 or FIG. 5, a pixel defining layer 112 is formed in the display area 11 and the non-display area 12 of the display panel 10, and a pixel electrode is disposed in the opening area of the pixel defining layer 112. The pixel electrode 111 is connected to the drain electrode 108 through a second via hole (not shown). A luminescent material layer 113 and a common electrode 114 are also formed on the pixel electrode 111.

After the layers are formed, the display area 11 and the non-display area 12 of the display panel 10 are packaged to be isolated from water and oxygen. In this embodiment, thin film package is employed, that is, a laminated structure of an inorganic film and an organic film is introduced In S5, the cutting grooves 30 are cut to form a plurality of independent display panels 10. After the package is completed, the display panel motherboard 1 is cut along the cutting line 13 to obtain a plurality of independent display panels 10.

In the prior art, as shown in FIG. 1, in a packaging process, the inorganic film 300 in the encapsulation layer is deposited on the display area 11 and the non-display area 12 of the display panel 10 by chemical vapor deposition, and the inorganic material is deposited on the display panel 10 through the opening area of the mask. Each opening area of the mask is disposed correspondingly to the display area 11 and the non-display area 12 of one of the display panels 10.

In an ideal state, the inorganic film 300 is deposited only on the display area 11 and the non-display area 12 of the display panel 10. However, since as a size of the panel is increased, a size of the mask is also increased gradually, the mask sags severely under the effect of gravity, that is, an edge area of the mask is inclined, and an actual deposition area of the inorganic material is larger than an ideal value during the package, that is, the inorganic film 300 is extended and deposited in the area to be cut, and when the area is subsequently cut, the inorganic film in the encapsulation layer is also cut, causing the inorganic film to break, and the cracks may extend to the display area 11 of the display panel 10, eventually impacting the packaging effect of the display panel 10.

Therefore, in order to prevent the inorganic film 300 from being deposited in the cutting area 20, a certain space is reserved in the non-display area 12 in the prior art, that is, the non-display area 12 includes the original non-display area 121 and an extended non-display area 122, so that an inorganic film 300 originally to be deposited in the cutting area is deposited on the extended non-display area 122. Although such a structure alleviates the generation of the cracks of the inorganic film 300 to a certain extent, since the width of the non-display area 12 is increased, it is disadvantageous to realize the narrow bezel design of the display panel 10.

In the present application, by providing a cutting groove 30 between adjacent ones of the display panels 10, the inorganic film 300 is deposited in the cutting grooves 30 and automatically broken during subsequent package, and the cracks in the unbroken portion generated during the cutting is limited to be in the cutting grooves 30, not propagating into the display area 11, thereby ensuring the packaging effect.

In addition, due to the presence of the cutting grooves 30, it is not necessary to provide a reserved space in the non-display area 12, which reduces the width of the non-display area 12, thus realizing a narrow bezel.

According to the above embodiment, it can be known that:

The present application provides a display panel motherboard and a method of manufacturing a display panel motherboard. The display panel motherboard includes a substrate; a plurality of display panels formed on the substrate; cutting grooves formed between front process layers of the plurality of display panels, wherein the cutting grooves include a first cutting groove and a second cutting groove, and an orthographic projection of the second cutting groove on the substrate covers and is larger than an orthographic projection of the first cutting groove on the substrate. By forming the first cutting groove and the second cutting groove in the front process layers between adjacent ones of the display panels, when the inorganic film in the encapsulation layer is deposited in the cutting grooves in the subsequent processes, the inorganic film is automatically broken, and the cutting cracks are confined in the cutting grooves and do not propagate into the display panel, effectively ensuring the effective area and its reliability of package.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel motherboard, comprising:
   a substrate;
   a plurality of display panels formed on the substrate;
   cutting grooves formed between front process layers of the plurality of display panels,
   wherein the cutting grooves comprise a first cutting groove and a second cutting groove, and an orthographic projection of the second cutting groove on the substrate covers and is larger than an orthographic projection of the first cutting groove on the substrate; and
   wherein the front process layers of the plurality of display panels comprise a base and an inorganic layer formed on the base, and the inorganic layer comprises a buffer layer, a gate insulating layer, an interlayer dielectric layer, and a passivation layer.

2. The display panel motherboard according to claim 1, wherein the first cutting groove is formed in the inorganic layer, and the second cutting groove is formed in the base.

3. The display panel motherboard according to claim 1, wherein the first cutting groove and the second cutting groove are both formed in the inorganic layer.

4. The display panel motherboard according to claim 3, wherein the first cutting groove and the second cutting groove are formed in adjacent layers respectively.

5. The display panel motherboard according to claim 1, wherein a centerline of the cutting grooves coincides with a cutting line between adjacent ones of the plurality of display panels.

6. The display panel motherboard according to claim 5, wherein a difference between a width of the second cutting groove and a width of the first cutting groove is greater than 1 micrometer.

7. The display panel motherboard according to claim 5, wherein a half of a difference between a width of the second cutting groove and a width of the first cutting groove is greater than a depth of the second cutting groove.

8. A method of manufacturing a display panel motherboard, comprising:
   providing a substrate;
   forming front process layers of a plurality of display panels on the substrate;
   forming cutting grooves between adjacent ones of the plurality of display panels, the cutting grooves comprising a first cutting groove and a second cutting groove, an orthographic projection of the second cutting groove on the substrate covering and larger than an orthographic projection of the first cutting groove on the substrate;
   forming an encapsulation layer on the display panel; and
   cutting the cutting grooves to form a plurality of independent display panels,
   wherein the step of forming front process layers of a plurality of display panels on the substrate comprises: forming a base on the substrate and forming an inorganic layer on the base, and the step of forming a base on the substrate and forming an inorganic layer on the base comprises: forming a buffer layer, a gate insulating layer, an interlayer dielectric layer, and a passivation layer on the base.

9. The method of manufacturing the display panel motherboard according to claim 8, wherein the step of forming cutting grooves between adjacent ones of the plurality of display panels, the cutting grooves comprising the first cutting groove and the second cutting groove, and an orthographic projection of the second cutting groove on the substrate covering and larger than an orthographic projection of the first cutting groove on the substrate comprises: forming the first cutting groove in the inorganic layer, and forming the second cutting groove in the base.

10. The method of manufacturing the display panel motherboard according to claim 8, wherein the step of forming cutting grooves between adjacent ones of the plurality of display panels, the cutting grooves comprising the first cutting groove and the second cutting groove, and an orthographic projection of the second cutting groove on the substrate covering and larger than an orthographic projection of the first cutting groove on the substrate comprises: forming the first cutting groove and the second cutting groove in the inorganic layer.

11. The method of manufacturing the display panel motherboard according to claim 10, wherein the step of forming the first cutting groove and the second cutting groove in the inorganic layer comprises: forming the first cutting groove and the second cutting groove in adjacent layers respectively.

12. The method of manufacturing the display panel motherboard according to claim 8, wherein the step of forming cutting grooves formed between adjacent ones of the plurality of display panels, the cutting groove comprising a first cutting groove and a second cutting groove, and an orthographic projection of the second cutting groove on the substrate covering and larger than an orthographic projection of the first cutting groove on the substrate comprises: forming the cutting grooves between adjacent ones of the plurality of display panels, a centerline of the cutting grooves coinciding with a cutting line between adjacent ones of the plurality of display panels.

13. The method of manufacturing the display panel motherboard according to claim 12, wherein the step of forming the cutting grooves between adjacent ones of the plurality of display panels, a centerline of the cutting grooves coinciding with a cutting line between adjacent ones of the plurality of display panels comprises: forming the first cutting groove and the second cutting groove having a width larger than the first cutting groove by 1 mm.

14. The method of manufacturing the display panel motherboard according to claim 12, wherein the step of forming the cutting grooves between adjacent ones of the plurality of display panels, a centerline of the cutting grooves coinciding with a cutting line between adjacent ones of the plurality of display panels comprises: forming the first cutting groove and the second cutting groove, the second cutting groove having a depth smaller than a half of a difference between a width of the second cutting groove width and a width of the first cutting groove.

* * * * *